(12) United States Patent
Bayerer et al.

(10) Patent No.: US 8,466,548 B2
(45) Date of Patent: Jun. 18, 2013

(54) SEMICONDUCTOR DEVICE INCLUDING EXCESS SOLDER

(75) Inventors: Reinhold Bayerer, Warstein (DE); Niels Oeschler, Moehnesee (DE); Alexander Ciliox, Moehnesee (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/118,748

(22) Filed: May 31, 2011

(65) Prior Publication Data

US 2012/0306087 A1    Dec. 6, 2012

(51) Int. Cl.
| H01L 23/15 | (2006.01) |
| H01L 23/06 | (2006.01) |
| H01L 23/52 | (2006.01) |
| H01L 23/495 | (2006.01) |
| H01L 21/50 | (2006.01) |
| H01L 21/48 | (2006.01) |

(52) U.S. Cl.
USPC .................. 257/703; 257/782; 257/E23.009; 257/E23.051; 438/125

(58) Field of Classification Search
USPC .... 257/703, 782, E23.009, E23.051; 438/125
See application file for complete search history.

(56) References Cited

U.S. PATENT DOCUMENTS

| 4,793,543 | A | * | 12/1988 | Gainey et al. .................. 228/121 |
| 5,372,295 | A | * | 12/1994 | Abe et al. .................... 228/123.1 |
| 6,388,203 | B1 | | 5/2002 | Rinne et al. |
| 6,392,163 | B1 | | 5/2002 | Rinne et al. |
| 7,215,020 | B2 | * | 5/2007 | Nakase et al. ................ 257/706 |
| 2008/0083994 | A1 | | 4/2008 | Lim |
| 2008/0093729 | A1 | * | 4/2008 | Siepe et al. ................... 257/703 |
| 2011/0070695 | A1 | | 3/2011 | Bayerer |
| 2011/0080251 | A1 | | 4/2011 | Takeuchi et al. |

FOREIGN PATENT DOCUMENTS

| JP | 2000031358 A | * | 1/2000 |
| JP | 2004119568 A | * | 4/2004 |

OTHER PUBLICATIONS

"New Assembly and Interconnects Beyond Sintering Methods", Karsten Guth, et al., Infineon Technologies AG, Infineon Technologies Austria AG, 2010 (6 pgs.).

* cited by examiner

*Primary Examiner* — Luan C Thai
(74) *Attorney, Agent, or Firm* — Dicke, Billig & Czaja, PLLC

(57) ABSTRACT

A semiconductor device includes a substrate including a first metal layer, a first semiconductor chip having sidewalls, and a first solder layer contacting the first semiconductor chip and the first metal layer. The first metal layer includes a groove extending around sidewalls of the first semiconductor chip. The groove is at least partly filled with excess solder from the first solder layer.

25 Claims, 5 Drawing Sheets

SEMICONDUCTOR DEVICE INCLUDING EXCESS SOLDER

BACKGROUND

Power electronic modules are semiconductor packages that are used in power electronic circuits. Power electronic modules are typically used in vehicular and industrial applications, such as in inverters and rectifiers. The semiconductor components included within the power electronic modules are typically insulated gate bipolar transistor (IGBT) semiconductor chips or metal-oxide-semiconductor field effect transistor (MOSFET) semiconductor chips. The IGBT and MOSFET semiconductor chips have varying voltage and current ratings. The semiconductor components included within the power electronic modules may also include diodes, thyristors, junction gate field-effect transistors (JFETs), and bipolar transistors. Both passive components and control electronics may be included within the power electronic modules. The semiconductor components are made from Si, SiC, GaN, GaAs, or other suitable substrates. Some power electronic modules include additional semiconductor diodes (i.e., free-wheeling diodes) in the semiconductor package for overvoltage protection.

In general, two different power electronic module designs are used. One design is for higher power applications and the other design is for lower power applications. For higher power applications, a power electronic module typically includes several semiconductor chips integrated on a single substrate. The substrate typically includes an insulating ceramic substrate, such as $Al_2O_3$, AN, $Si_3N_4$, or other suitable material, to insulate the power electronic module. At least the top side of the ceramic substrate is metallized with either pure or plated Cu, Al, or other suitable material to provide electrical and mechanical contacts for the semiconductor chips. The metal layer is typically bonded to the ceramic substrate using a direct copper bonding (DCB) process, a direct aluminum bonding process (DAB) process, or an active metal brazing (AMB) process.

Typically, soft soldering with Sn—Pb, Sn—Ag, Sn—Ag—Cu, or another suitable solder alloy is used for joining a semiconductor chip to a metallized ceramic substrate. Typically, several substrates are combined onto a metal baseplate. In this case, the backside of the ceramic substrate is also metallized with either pure or plated Cu, Al, or other suitable material for joining the substrates to the metal baseplate. To join the substrates to the metal baseplate, soft soldering with Sn—Pb, Sn—Ag, Sn—Ag—Cu, or another suitable solder alloy is typically used.

For lower power applications, instead of ceramic substrates, leadframe substrates (e.g., pure Cu substrates) are typically used. Depending upon the application, the leadframe substrates are typically plated with Ni, Ag, Au, and/or Pd. Typically, soft soldering with Sn—Pb, Sn—Ag, Sn—Ag—Cu, or another suitable solder alloy is used for joining a semiconductor chip to a leadframe substrate.

For high temperature applications, the low melting point of the solder joints ($T_m$=180° C.-220° C.) becomes a critical parameter for power electronic modules. During operation of power electronic modules, the areas underneath the semiconductor chips are exposed to high temperatures. In these areas, the ambient air temperature is superposed by the heat that is dissipated inside the semiconductor chip. This leads to a thermal cycling during operation of the power electronic modules. Typically, with respect to thermal cycling reliability, a reliable function of a solder joint cannot be guaranteed above 150° C. Above 150° C., cracks may form inside the solder region after a few thermal cycles. The cracks can easily spread over the entire solder region and lead to the failure of the power electronic module.

With the increasing desire to use power electronics in harsh environments (e.g., automotive applications) and the ongoing integration of semiconductor chips, the externally and internally dissipated heat continues to increase. Therefore, there is a growing demand for high temperature power electronic modules capable of operating with internal and external temperatures up to and exceeding 200° C.

For these and other reasons, there is a need for the present invention.

SUMMARY

One embodiment provides a semiconductor device. The semiconductor device includes a substrate including a first metal layer, a first semiconductor chip having sidewalls, and a first solder layer contacting the first semiconductor chip and the first metal layer. The first metal layer includes a groove extending around sidewalls of the first semiconductor chip. The groove is at least partly filled with excess solder from the first solder layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As used herein, the term "electrically coupled" is not meant to mean that the elements must be directly coupled together and intervening elements may be provided between the "electrically coupled" elements.

Figure 1:
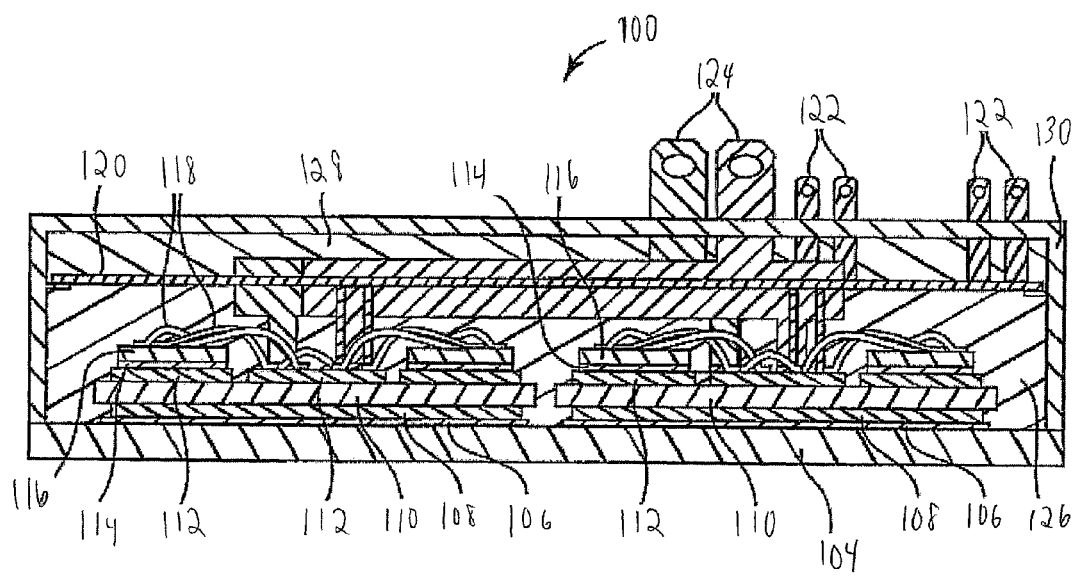
FIG. 1 illustrates a cross-sectional view of one embodiment of a semiconductor device.

FIG. 1 illustrates a cross-sectional view of one embodiment of a semiconductor device 100. In one embodiment, semiconductor device 100 is a high temperature (i.e., up to and exceeding 200° C.) high power electronic module. Power electronic module 100 includes a metal baseplate 104, soldered or sintered joints 106, metalized ceramic substrates 110 including metal surfaces or layers 108 and 112, diffusion soldered joints 114, semiconductor chips 116, bond wires 118, circuit board 120, control contacts 122, power contacts 124, potting 126 and 128, and a housing 130. In other embodiments, metal baseplate 104 is replaced with a substrate, and circuit board 120 is excluded and control contacts 122 are copper leads, pins, or other suitable contacts.

Diffusion soldering provides a high melting point bond between each semiconductor chip 116 and metalized ceramic substrate 110. During the diffusion soldering process of each semiconductor chip 116 to the corresponding metalized ceramic substrate 110, it is advantageous to apply some pressure to the semiconductor chip. The pressure squeezes out excess solder from under the semiconductor chip resulting in small droplets of solder around the semiconductor chip and wetting of the surrounding surface of the metallized ceramic substrate. If two or more semiconductor chips are placed in close proximity on the same metallized ceramic substrate, the excess solder may be pressed to the top surface of the semiconductor chips and may electrically short contacts on the top surface of the semiconductor chips. In addition, the solder droplets cause ultrasonic bonding to fail when the bonds are placed close to semiconductor chip edges.

Accordingly, semiconductor device 100 includes solder reservoirs, which are illustrated in detail in FIGS. 2-5, around each semiconductor chip 116. The solder reservoirs take up the volume of the excess solder to prevent the electrical short circuits and ultrasonic bonding failures described above. As disclosed in detail below with reference to FIGS. 2-5, the solder reservoirs include a groove formed in metal layer 112 of metalized ceramic substrate 110 or a spacer, which is attached to the back side of each semiconductor chip 116.

Ceramic substrates 110 include $Al_2O_3$, AN, $Si_3N_4$, or other suitable material. In one embodiment, ceramic substrates 110 each have a thickness within a range of 0.2 mm to 2.0 mm. Metal layers 108 and 112 include Cu, Al, or another suitable material. In one embodiment, metal layers 108 and/or 112 are plated with Ni, Ag, Au, and/or Pd. In one embodiment, metal layers 108 and 112 each have a thickness within a range of 0.1 mm to 0.6 mm. Soldered or sintered joints 106 join metal layers 108 to metal baseplate 104. Diffusion soldered joints 114 join metal layers 112 to semiconductor chips 116.

Semiconductor chips 116 are electrically coupled to metal layers 112 through bond wires 118. Bond wires 118 include Al, Cu, Al—Mg, Au, or another suitable material. In one embodiment, bond wires 118 are bonded to semiconductor chips 116 and metal layers 112 using ultrasonic wire bonding. Metal layers 112 are electrically coupled to circuit board 120 and power contacts 124. Circuit board 120 is electrically coupled to control contacts 122.

Housing 130 encloses soldered or sintered joints 106, metallized ceramic substrates 110 including metal layers 108 and 112, diffusion soldered joints 114, semiconductor chips 116, bond wires 118, circuit board 120, portions of control contacts 122, and portions of power contacts 124. Housing 130 includes technical plastics or another suitable material. Housing 130 is joined to metal baseplate 104. In one embodiment, a single metallized ceramic substrate 110 is used such that metal baseplate 104 is excluded and housing 130 is joined directly to the single metallized ceramic substrate 110.

Potting material 126 fills areas below circuit board 120 within housing 130 around soldered or sintered joints 106, metallized ceramic substrates 110 including metal layers 108 and 112, diffusion soldered joints 114, semiconductor chips 116, and bond wires 118. Potting material 128 fills the area above circuit board 120 within housing 130 around portions of control contacts 122 and portions of power contacts 124. Potting material 126 and 128 includes silicone gel or another suitable material. Potting material 126 and 128 prevents damage to power electronic module 100 by dielectrical breakdown. In other embodiments, a single layer of potting material is used to at least cover bond wires 118.

Figure 2:
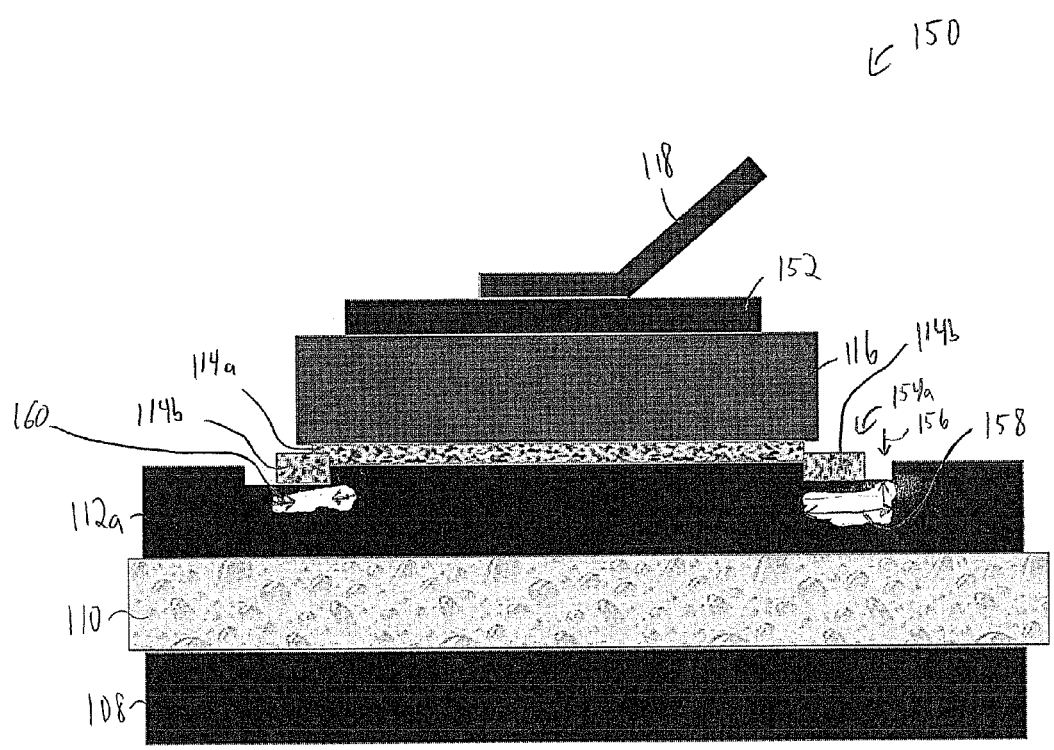
FIG. 2 illustrates a cross-sectional view of one embodiment of a semiconductor device including a solder reservoir.

FIG. 2 illustrates a cross-sectional view of one embodiment of a semiconductor device 150 including a solder reservoir 154a. Semiconductor device 150 includes a metallized ceramic substrate 110 including metal layers 108 and 112a, a solder layer 114a, excess solder 114b, a semiconductor chip 116 including front side metal 152, and a wire bond or clip 118. Semiconductor chip 116 is electrically coupled to other devices through a contact formed by front side metal 152 and wire bond or clip 118. For simplicity, semiconductor device 150 includes one contact pad of front side metal 152 and one wire bond or clip 118. In other embodiments, however, semiconductor device 150 may include any suitable number of contact pads and wire bonds or clips. In one embodiment, the illustrated cross-section of semiconductor device 150 is also applicable to a cross-section of semiconductor device 150 perpendicular to the illustrated cross-section such that solder reservoir 154a surrounds semiconductor chip 116.

Semiconductor chip 116 is bonded to metal layer 112a of metallized ceramic substrate 110 via solder layer 114a. Semiconductor chip 116 is diffusion soldered to metal layer 112a such that solder layer 114a provides an intermetallic joint between semiconductor chip 116 and metal layer 112a while excess solder 114b squeezed out from under semiconductor chip 116 during the diffusion soldering process collects in solder reservoir 154a. Excess solder 114b includes soft solder after the diffusion soldering process while solder layer 114a is completely solidified to provide a pure intermetallic joint (e.g., $Cu_3Sn$, $Cu_6Sn_5$) after the diffusion soldering process. In one embodiment, the diffusion soldered joint 114a has a thickness less than 10 μm.

Solder reservoir 154a is a groove in metal layer 112a extending around the sidewalls of semiconductor chip 116. In this embodiment, the sidewalls of semiconductor chip 116 extend over a portion of the groove by a distance as indicated at 160. In one embodiment, distance 160 is less than or equal to the width of the edge termination on the top side of semiconductor chip 116. In another embodiment, distance 160 is less than or equal to about 0.2 mm. In one embodiment, the width of groove 154a as indicated at 158 is between about 10 μm and 3 mm. The depth of groove 154a as indicated at 156 is between about 10 μm and 66% of the thickness of metal layer 112a. For example, for a 300 μm thick metal layer 112a, groove 154a has a depth between about 10 μm and 200 μm. In any case, the dimensions of groove 154a are selected such that excess solder 114b is contained within groove 154a. In one embodiment, groove 154a is partially filled with excess solder 114b as illustrated in FIG. 2 after the diffusion soldering process. In other embodiments, groove 154a may be completely filled with excess solder 114b after the diffusion soldering process.

Figure 3:
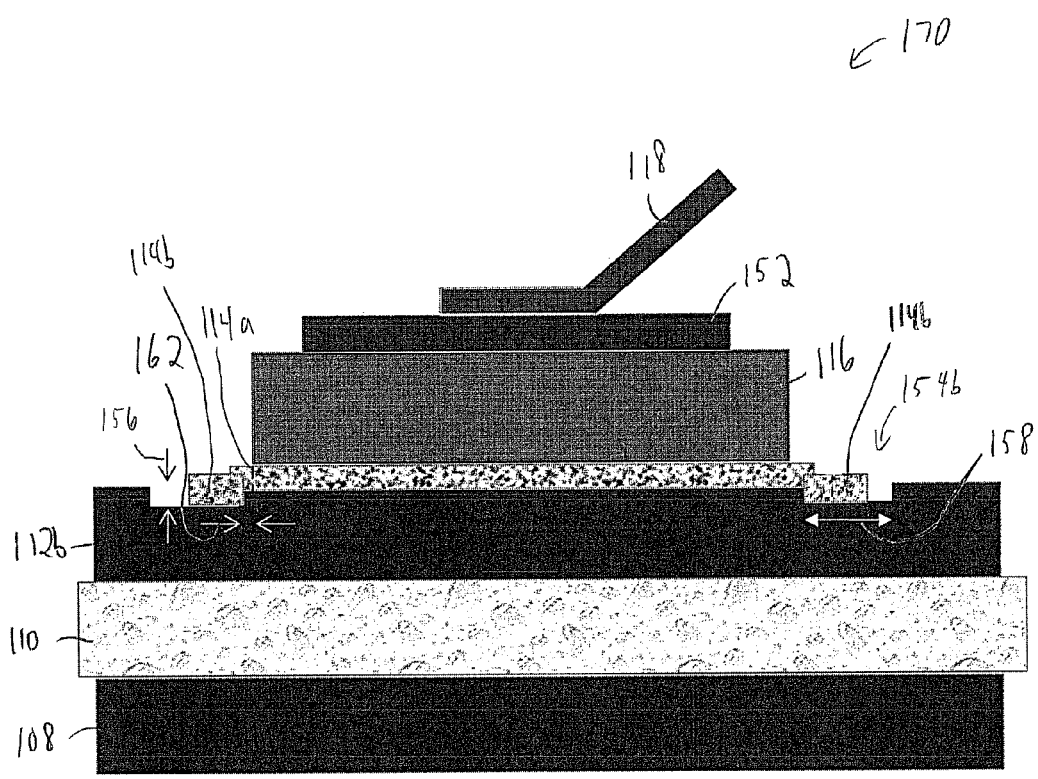
FIG. 3 illustrates a cross-sectional view of another embodiment of a semiconductor device including a solder reservoir.

FIG. 3 illustrates a cross-sectional view of another embodiment of a semiconductor device 170 including a solder reservoir 154b. Semiconductor device 170 is similar to semiconductor device 150 previously described and illustrated with reference to FIG. 2, except that in semiconductor device 170 the solder reservoir is arranged at a different location relative to the sidewalls of semiconductor chip 116.

In this embodiment, solder reservoir 154b is a groove in metal layer 112b extending around the sidewalls of semiconductor chip 116. The sidewalls of semiconductor chip 116 are laterally spaced apart from the groove by a distance as indicated at 162. In one embodiment, distance 162 is less than or equal to about 0.3 mm. The depth 156 and width 158 of groove 154b are similar to the depth and width of groove 154a previously described and illustrated with reference to FIG. 2.

Figure 4:
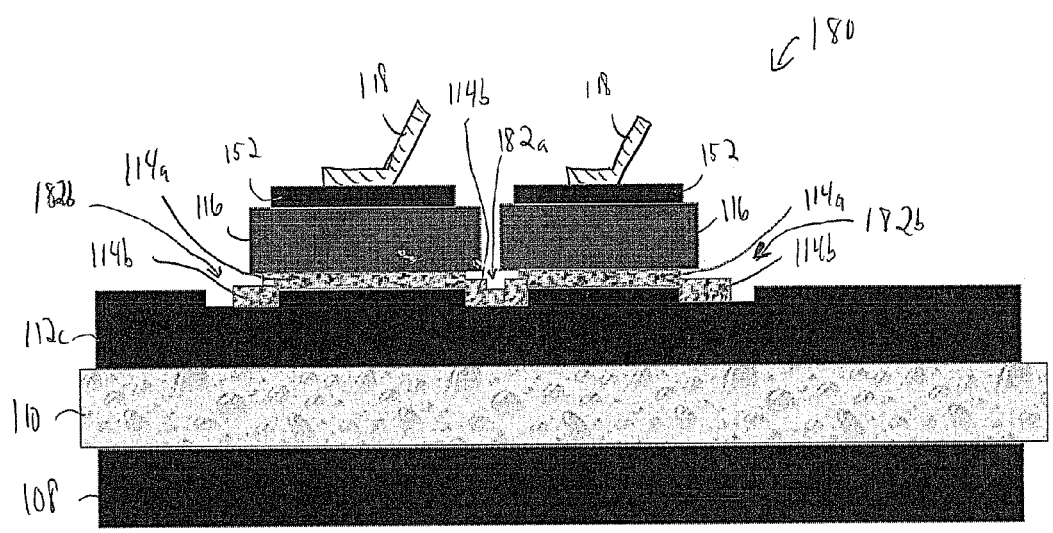
FIG. 4 illustrates a cross-sectional view of another embodiment of a semiconductor device including a solder reservoir.

FIG. 4 illustrates a cross-sectional view of another embodiment of a semiconductor device 180 including a solder reservoir 182a, 182b. Semiconductor device 180 includes two semiconductor chips 116 arranged adjacent to one another. Each semiconductor chip 116 is bonded to metal layer 112c of metallized ceramic substrate 110 via a solder layer 114a. Each semiconductor chip 116 is diffusion soldered to metal layer 112c such that solder layer 114a provides an intermetallic joint between each semiconductor chip 116 while excess solder 114b squeezed out from under each semiconductor chip 116 during the diffusion soldering process collects in solder reservoir 182a, 182b.

In this embodiment, the solder reservoir includes a groove 182a in metal layer 112c between inner adjacent sidewalls of the semiconductor chips 116 and a groove 114a in metal layer 112c extending around the outer sidewalls of semiconductor chips 116. Excess solder squeezed out from under one of semiconductor chips 116 is collected in groove 182b around the outer sidewalls of the corresponding semiconductor chip 116 while excess solder squeezed out from under both semiconductor chips 116 is collected in groove 182a.

In one embodiment, the depth and width of each groove 182a and 182b is similar to the depth 156 and width 158 of groove 154a previously described and illustrated with reference to FIG. 2. In another embodiment, the width of groove 182a is greater than the width of groove 182b. In this embodiment, the sidewalls of each semiconductor chip 116 in semiconductor device 180 extend over a portion of grooves 182a and 182b by a distance 160 as previously described and illustrated with reference to FIG. 2. In other embodiments, however, the sidewalls of each semiconductor chip 116 in semiconductor device 180 may not extend over a portion of grooves 182a and 182b such that the sidewalls each semiconductor chip 116 are laterally spaced apart from grooves 182a and 182b by a distance 162 as previously described and illustrated with reference to FIG. 3.

Figure 5:
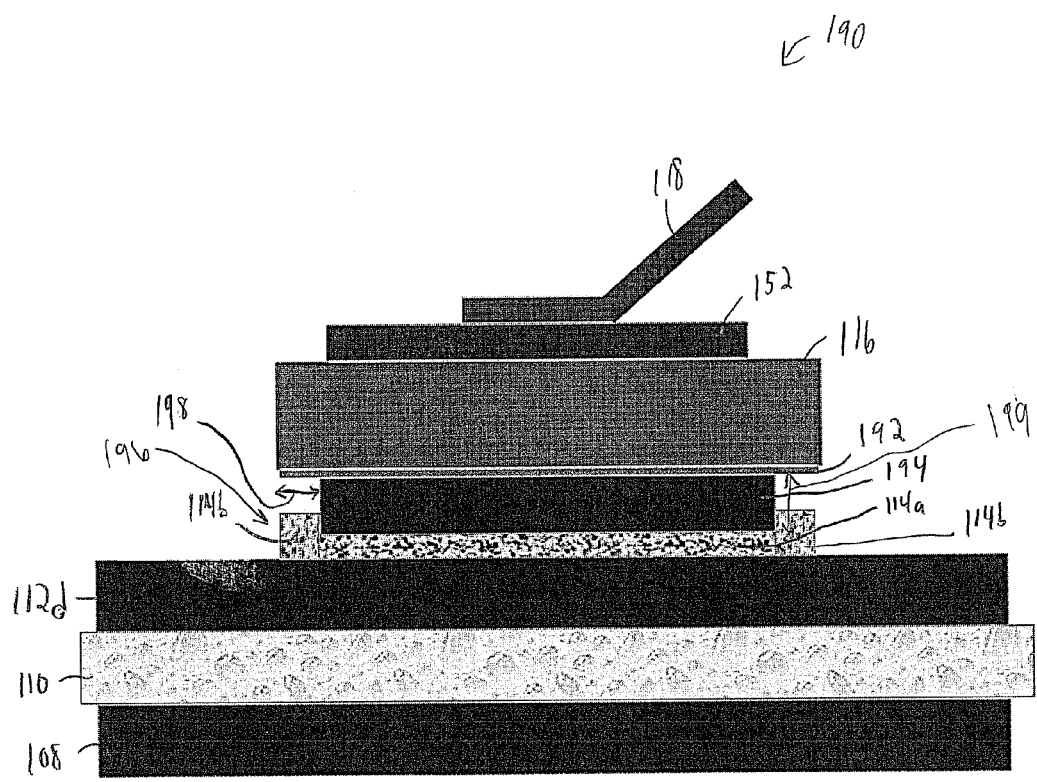
FIG. 5 illustrates a cross-sectional view of another embodiment of a semiconductor device including a solder reservoir formed by a spacer.

FIG. 5 illustrates a cross-sectional view of another embodiment of a semiconductor device 190 including a solder reservoir 196 formed by a spacer 194. Semiconductor device 190 includes a metallized ceramic substrate 110 including metal layers 108 and 112d, a solder layer 114a, excess solder 114b, a spacer 194, a semiconductor chip 116 including front side metal 152 and back side metal 192, and a wire bond or clip 118. Spacer 194 is a metal layer, such as Cu, Al, or other suitable material, deposited on back side metal 192 of semiconductor chip 116.

In this embodiment, semiconductor chip 116 is bonded to metal layer 112d of metallized ceramic substrate 110 through metal layer 194 and solder layer 114a. Metal layer 194 is diffusion soldered to metal layer 112d such that solder layer 114a provides an intermetallic joint between metal layer 194 and metal layer 112d while excess solder 114b squeezed out from under metal layer 194 during the diffusion soldering process collects in solder reservoir 196. Excess solder 114b includes soft solder after the diffusion soldering process while solder layer 114a is completely solidified to provide a pure intermetallic joint (e.g., $Cu_3Sn$, $Cu_6Sn_5$, $SnAg_3$, Sn—Ni alloy, or other suitable alloys depending on the metallization to be soldered) after the diffusion soldering process. In one embodiment, the diffusion soldered joint 114a has a thickness less than 10 μm.

Semiconductor chip 116 extends past the sidewalls of metal layer 194 such that the sidewalls of semiconductor chip 116 are laterally spaced apart from the sidewalls of metal layer 194 by a distance as indicated at 198. In one embodiment, distance 198 is less than or equal to the width of the edge termination on the top side of semiconductor chip 116. In another embodiment, distance 198 is between about 10 μm and 200 μm. In one embodiment, the thickness of metal layer 194 as indicated at 199 is greater than 5 μm. In other embodiments, thickness 199 of metal layer 194 is greater than 8 μm, 10 μm, 20 μm, or 100 μm. In any case, thickness 199 of metal layer 194 and distance 198 are selected such that excess solder 114b is contained in the space below the edges of the semiconductor chip 116. In one embodiment, as illustrated in FIG. 5, excess solder 114b contacts the sidewalls of metal layer 194 but does not contact semiconductor chip 116. In other embodiments, excess solder 114b may contact the bottom of semiconductor chip 116.

Embodiments provide a semiconductor device including a solder reservoir to contain excess solder when a semiconductor chip is diffusion soldered onto a metal layer of a substrate. The solder reservoir is provided by a groove in the metal layer of the substrate or by a spacer between the semiconductor chip and the substrate. By containing the excess solder from the diffusion soldering process, short circuits and ultrasonic bonding failures are prevented.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor device comprising:
   a substrate comprising a first metal layer;
   a first semiconductor chip having sidewalls; and
   a first solder layer contacting the first semiconductor chip and the first metal layer, the first solder layer comprising a diffusion soldered layer,
   wherein the first metal layer includes a groove extending around sidewalls of the first semiconductor chip, the groove at least partly filled with excess solder from the first solder layer, and
   wherein the first solder layer provides an intermetallic joint between the first semiconductor chip and the first metal layer.

2. The semiconductor device of claim 1, wherein the intermetallic joint has a melting temperature greater than 400° C., and
   wherein the excess solder comprises soft solder.

3. The semiconductor device of claim 1, wherein the first solder layer has a thickness less than 10 μm.

4. The semiconductor device of claim 1, wherein the sidewalls of the first semiconductor chip extend over a portion of the groove.

5. The semiconductor device of claim 1, wherein the groove is laterally spaced apart from the sidewalls of the first semiconductor chip.

6. The semiconductor device of claim 1, wherein the groove has a depth between 10 μm and 66% of a thickness of the first metal layer.

7. The semiconductor device of claim 1, further comprising:
 a second semiconductor chip adjacent to the first semiconductor chip; and
 a second solder layer contacting the second semiconductor chip and the first metal layer,
 wherein the groove is at least partly filled with excess solder from the second solder layer.

8. The semiconductor device of claim 1, wherein the substrate comprises a second metal layer and a ceramic layer between the first metal layer and the second metal layer.

9. A semiconductor device comprising:
 a substrate comprising a first metal layer;
 a semiconductor chip having sidewalls;
 a second metal layer on a bottom side of the semiconductor chip, the second metal layer having sidewalls; and
 a solder layer contacting the second metal layer and the first metal layer, the solder layer comprising a diffusion soldered layer,
 wherein the semiconductor chip extends over the sidewalls of the second metal layer such that the sidewalls of the semiconductor chip are laterally spaced apart from the sidewalls of the second metal layer, and
 wherein excess solder from the solder layer contacts the sidewalls of the second metal layer.

10. The semiconductor device of claim 9, wherein the second metal layer has a thickness of at least 5 μm, and
 wherein the sidewalls of the semiconductor chip are laterally spaced apart from the sidewalls of the second metal layer by at least 10 μm.

11. The semiconductor device of claim 9, wherein the solder layer provides an intermetallic joint between the second metal layer and the first metal layer, the intermetallic joint having a melting temperature greater than 400° C., and
 wherein the excess solder comprises soft solder.

12. The semiconductor device of claim 9, wherein the solder layer has a thickness less than 10 μm.

13. The semiconductor device of claim 9, wherein the bottom side of the semiconductor chip is spaced apart from the excess solder.

14. The semiconductor device of claim 9, wherein the substrate comprises a third metal layer and a ceramic layer between the first metal layer and the third metal layer.

15. A method for fabricating a semiconductor device, the method comprising:
 providing a substrate comprising a first metal layer, a second metal layer, and a ceramic layer between the first metal layer and the second metal layer;
 forming a groove in the first metal layer;
 providing a first semiconductor chip; and
 diffusion soldering the first semiconductor chip to the first metal layer such that excess solder from the diffusion soldering collects in the groove,
 wherein the diffusion soldering provides an intermetallic joint between the first semiconductor chip and the first metal layer.

16. The method of claim 15, wherein forming the groove comprises forming the groove such that sidewalls of the first semiconductor chip extend over a portion of the groove.

17. The method of claim 15, wherein forming the groove comprises forming the groove such that sidewalls of the first semiconductor chip are laterally spaced apart from the groove.

18. The method of claim 15, further comprising:
 providing a second semiconductor chip; and
 diffusion soldering the second semiconductor chip to the first metal layer such that excess solder from the diffusion soldering collects in the groove.

19. The method of claim 15, wherein the diffusion soldering provides the intermetallic joint having a thickness less than 10 μm between the first semiconductor chip and the first metal layer, and
 wherein the excess solder comprises soft solder.

20. A method for fabricating a semiconductor device, the method comprising:
 providing a substrate comprising a first metal layer, a second metal layer, and a ceramic layer between the first metal layer and the second metal layer;
 providing a semiconductor chip;
 providing a third metal layer on a bottom side of the semiconductor chip such that the semiconductor chip extends over sidewalls of the third metal layer; and
 diffusion soldering the third metal layer to the first metal layer such that excess solder contacts the sidewalls of the third metal layer.

21. The method of claim 20, wherein providing the third metal layer comprises providing the third metal layer having a thickness of at least 5 μm and such that sidewalls of the semiconductor chip are laterally spaced apart from sidewalls of the third metal layer by at least 10 μm.

22. The method of claim 20, wherein diffusion soldering the third metal layer to the first metal layer comprises diffusion soldering the third metal layer to the first metal layer such that the excess solder is spaced apart from the bottom side of the semiconductor chip.

23. The method of claim 20, wherein the diffusion soldering provides an intermetallic joint having a thickness less than 10 μm between the third metal layer and the first metal layer, and
 wherein the excess solder comprises soft solder.

24. The semiconductor device of claim 1, wherein the intermetallic joint comprises one of $Cu_3Sn$, $Cu_6Sn_5$, $SnAg_3$, and Sn—Ni.

25. The method of claim 15, wherein the intermetallic joint comprises one of $Cu_3Sn$, $Cu_6Sn_5$, $SnAg_3$, and Sn—Ni.

* * * * *